(12) United States Patent
Kohno et al.

(10) Patent No.: US 6,372,550 B2
(45) Date of Patent: Apr. 16, 2002

(54) SEMICONDUCTOR DEVICE AND METHOD FOR MANUFACTURING SAME (75) Inventors: Junko Kohno; Kazunori Asano, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/878,893

(22) Filed: Jun. 11, 2001

Related U.S. Application Data (62) Division of application No. 09/266,652, filed on Mar. 11, 1999, now Pat. No. 6,259,156.

(30) Foreign Application Priority Data

Mar. 13, 1998 (JP) ............................................ 10-082544

(51) Int. Cl.[7] ................................................. H01L 21/50
(52) U.S. Cl. ....................................... 438/122; 438/119
(58) Field of Search .......................... 257/707; 438/118, 438/122, FOR 369, FOR 381

(56) References Cited

U.S. PATENT DOCUMENTS 5,757,081 A    5/1998  Chang et al. ................ 257/778

FOREIGN PATENT DOCUMENTS

| JP | 49-11580 | 2/1974 |
| JP | 55-151371 | 11/1980 |
| JP | 59-124750 | 7/1984 |
| JP | 4-184963 | 7/1992 |
| JP | 5-166980 | 7/1993 |
| JP | 6-5633 | 1/1994 |
| JP | 9-162198 | 6/1997 |
| JP | 10-65072 | 3/1998 |

*Primary Examiner*—George Fourson
*Assistant Examiner*—Thanh V Pham
(74) *Attorney, Agent, or Firm*—Scully, Scott, Murphy & Presser

(57) ABSTRACT

To provide a semiconductor device that is capable of transmitting heat evolved in an active element efficiently to a heat sink member, and a manufacturing method for the semiconductor device. One of the terminals (such as drain electrode) of an active element formed in a substrate of, for example, GaAs, is thermally contacted with a heat sink member via an insulating member of, for example, aluminum nitride, exhibiting thermally conductive and electrically insulating properties. The heat sink member may, for example, be an electrically conductive member connected to another terminal of the active element, or a heat sink of a package.

3 Claims, 6 Drawing Sheets

SEMICONDUCTOR DEVICE AND METHOD FOR MANUFACTURING SAME

The present application is a divisional of application Ser. No. 09/266,652 filed on Mar. 11, 1999, now U.S. Pat. No. 6,259,156.

FIELD OF THE INVENTION

This invention relates to a semiconductor device and, more particularly, to a high-output-power field-effect transistor (FET) connected to a package by a face-down system.

RELATED ART

The semiconductor device, formed of a GaAs based semiconductor material, is used in a majority of cases as a semiconductor device for which high-speed response is required in view of its characteristics as a material. However, since heat evolution in an element deteriorates characteristics of the semiconductor device, there is presented a problem of how to improve the cooling efficiency of the device.

For example, in a semiconductor device of the type of dissipating the heat evolved from the semi conductor substrate, there is used a technique of reducing the thickness of the GaAs substrate having low thermal conductivity to assist in thermal diffusion (heat dissipation). However, the semiconductor device suffers from a drawback that, if the substrate is reduced in thickness, the device is lowered in mechanical strength. For increasing the thermal diffusion (heat dissipation) efficiency without weakening the mechanical strength, there is disclosed in, for example, the JP Patent Kokai JP-A-59-124750 and JP Patent Kokai JP-06-005633, a method for interconnecting a substrate and a heat sink via an electrically conductive layer.

On the other hand, in a semiconductor device of the type in which the heat evolved from the device is dissipated from an electrode on the semiconductor substrate surface provided with the insulating film or the electrode, there is used a technique of dissipating the heat via an electrically conductive member electrically connected to the electrode or a heat sink member.

In particular, in the high-output-power field effect transistor (FET), there is routinely used flip-chip mounting of the face-down system in which a gate electrode interconnection formed on a GaAs substrate is intimately contacted with the package heat sink.

Figure 12:
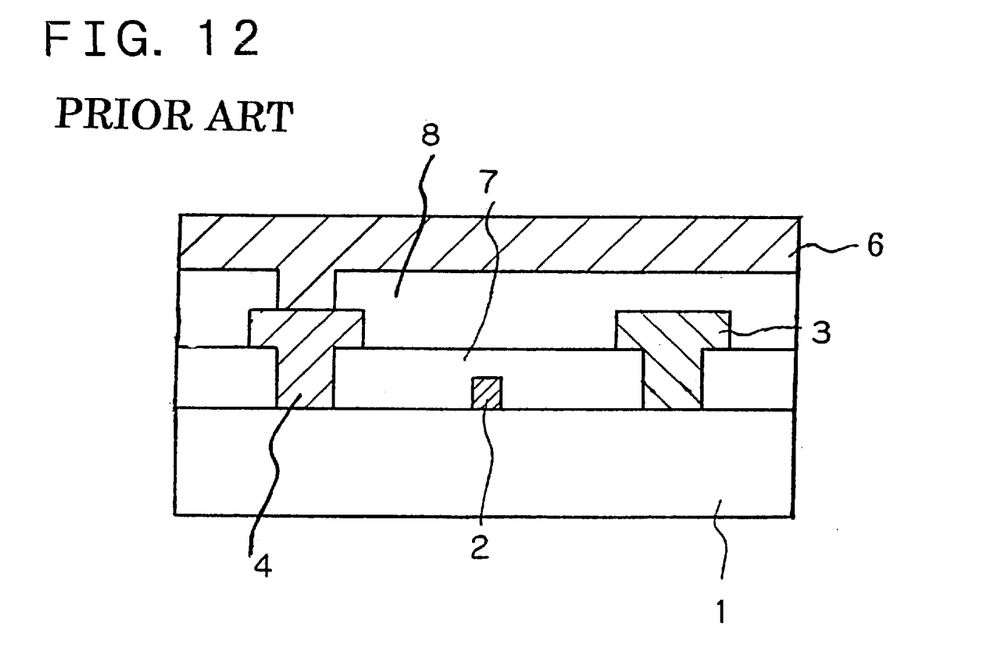
FIG. 12 illustrates a conventional semiconductor device.
Figure 13:
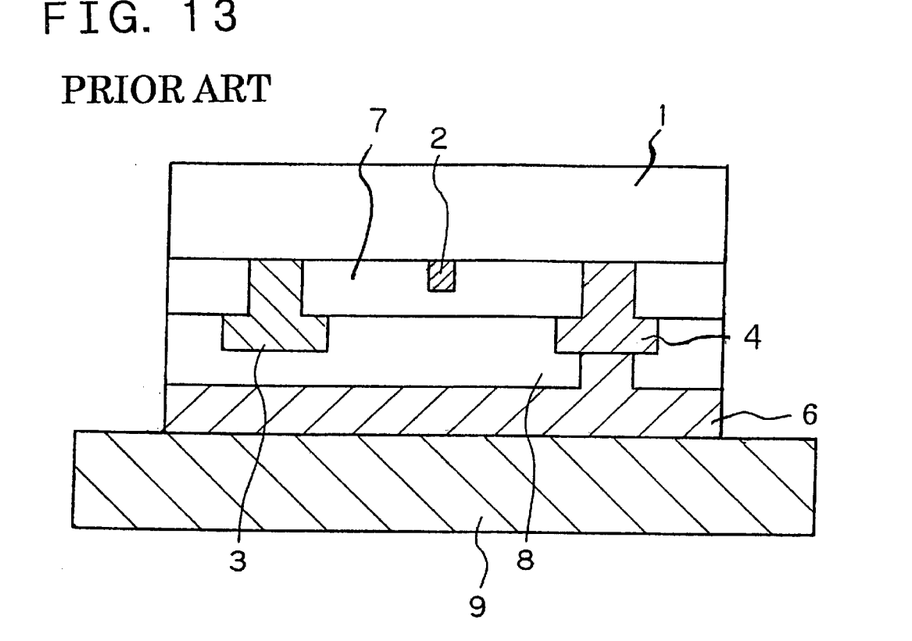
FIG. 13 is a cross-sectional view showing the mounted state of the conventional semiconductor device.

FIG. 12 shows the cross-section of a conventional semiconductor device, while FIG. 13 shows the cross-section of the semiconductor device of FIG. 12 mounted on a package.

Referring to FIGS. 12 and 13, the manufacturing method of a conventional semiconductor device is explained step-by-step.

Referring to FIG. 12, a gate electrode 2 is first formed on a substrate of, for example, GaAs, and subsequently a first insulating film 7 is deposited on the entire surface of the substrate 1. At areas of the first insulating film 7 in which a source electrode 4 and a drain electrode 3 are formed, holes are formed, and TiAu sputtering is then applied to form an electrically conductive layer for plating followed by Au plating to form the source electrode 4 and the drain electrode 3.

A second insulating film 8 is then deposited on the entire surface to overlie the first insulating film 7, source electrode 4 and the drain electrode 3 and planarized. The area of the planarized second insulating film 8 in register with the source electrode 4 is then bored, i.e. the exposed portion (bore in a mask) of the second insulating film 8 is removed. Then, TiAu etc. designed to serve as an electrically conductive layer for the plating is sputtered on the entire surface to form a thick plating film of Au resulting in an electrically conductive member 6. This gives an active element having a cross-sectional shape as shown in FIG. 12.

The active element, shown in FIG. 12, is bonded by thermal pressure bonding to a package heat sink 9 by the face-down system to effect flip-chip mounting, as shown in FIG. 13.

SUMMARY OF THE DISCLOSURE

Figure 14:
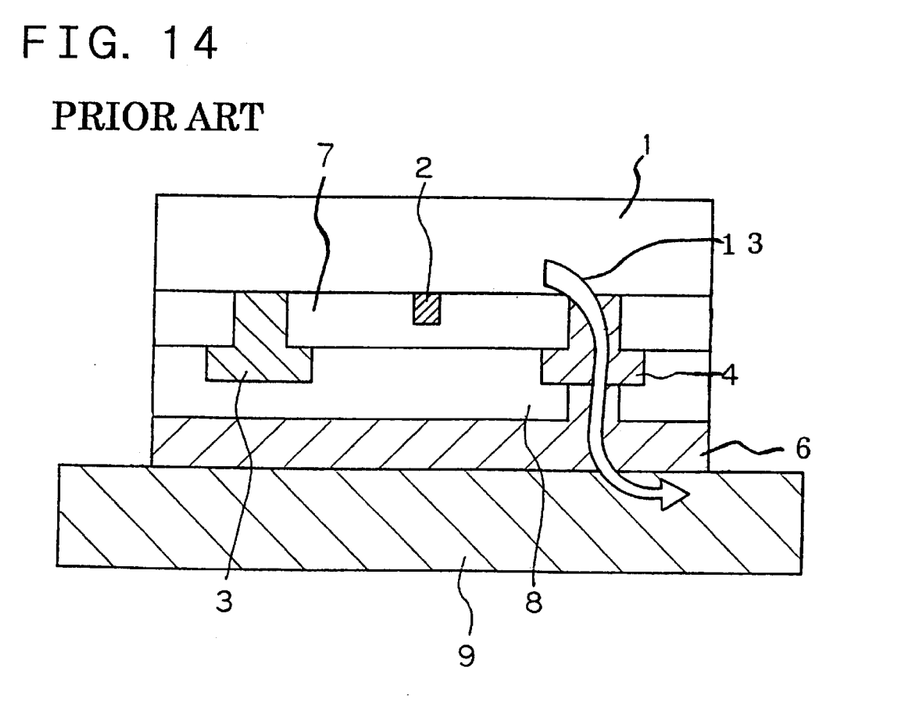
FIG. 14 is a schematic cross-sectional view showing the state of thermal diffusion (heat dissipation) of the semiconductor device.

However, in the course of the investigations toward the present invention the following problems have been encountered. Namely, the above-described conventional semiconductor device has the following drawbacks. Referring to FIG. 14, schematically illustrating the drawbacks of the conventional semiconductor device shown in FIG. 13, the thermal diffusion (heat dissipation) path 13 is solely a path connecting from the source electrode 4 via the electrically conductive member 6 to the package heat sink 9, while there is no heat conducting path for the heat evolved on the side of the drain electrode 3, so that the heat evolved on the semiconductor device cannot be dissipated efficiently towards the package.

In view of the above drawbacks, it is an object of the present invention to provide a semiconductor device which is capable of dissipating the heat evolved on the semiconductor device efficiently towards the package, and a manufacturing method therefor.

For accomplishing the above object, the present invention provides a device in which an insulator having high electrical insulating properties and high thermal conductivity above (on top of) a drain electrode and in which this insulator is thermally contacted with a lead-out interconnection layer of a source electrode.

According to the present invention, generally, there is provided a semiconductor device comprising:

a plurality of heat dissipating paths, each for each of a pre-set number of terminals of an active element, the heat dissipating paths being adapted for transmitting heat from the terminals of the active element to a heat sink member, wherein the pre-set number of terminals being constructed so as not being electrically connected to one another by the heat radiating paths and the heat sink members.

In the semiconductor device, in at least one of the heat dissipating paths, there is inserted in a path reaching the heat sink member a member exhibiting good thermal conductivity and electrically insulating properties, termed as an "insulating member".

Also there is provided a semiconductor device wherein a first terminal of the active element is connected via an electrically conductive member to a heat sink member, and wherein a second terminal of the active element transmits heat to the heat sink member via at least an insulating member interposed in-between.

In one aspect, the present invention provides an arrangement in which an electrically conductive member connected to a terminal of an active element formed on a substrate is connected via an insulating member to the other terminal of said active element and in which said electrically conductive member is connected to a heat sink member of the package accommodating said active element.

In another aspect, the present invention provides an arrangement in which a terminal of an active element formed on a substrate is connected via an insulating member to a heat sink member of a package used for mounting said active element.

The present invention provides a method for producing a semiconductor device in which an active element formed on a substrate is connected to a heat sink member of a package accommodating the active element, comprising the steps of:
(a) forming a gate electrode on the substrate;
(b) forming a first insulating film having holes provided in the substrate at positions of a drain electrode and a source electrode respectively;
(c) forming the drain electrode and the source electrode on the substrate;
(d) forming a second insulating film on the entire surface of the substrate and planarizing the surface until the drain electrode and the source electrode are exposed;
(e) forming an insulating member on the drain electrode;
(f) forming on the substrate a third insulating film having a hole provided in register with the source electrode and planarizing the surface until the surface of the insulating member of the drain electrode is exposed; and
(g) forming an electrically conductive member on the third insulating film.

Preferably, all or part of the insulating member may be a member comprising aluminum nitride, while a high-output-power FET formed on a GaAs substrate may be used as an active element.

Other features of the present invention will become apparent from the entire disclosure including claims and accompanying drawings.

PREFERRED EMBODIMENTS OF THE INVENTION

The present invention is hereinafter explained in detail with reference to a preferred embodiment and examples of execution showing the manner of executing the embodiment.

In a preferred embodiment of the fine wiring/interconnection forming method of the present invention, an insulator of high electrical insulating properties and good thermal conductivity (such as aluminum nitride (5 of FIG. 6)) is formed on one of electrodes (such as drain electrode (3 of FIG. 6)) of an active element formed on a semiconductor substrate of a semiconductor device. The active element is connected to a package. The insulator is connected to an interconnection layer of the other electrode (such as an interconnection layer of a source electrode (6 of FIG. 6) or to a heat sink of the package (9 of FIG. 9).

Figure 6:
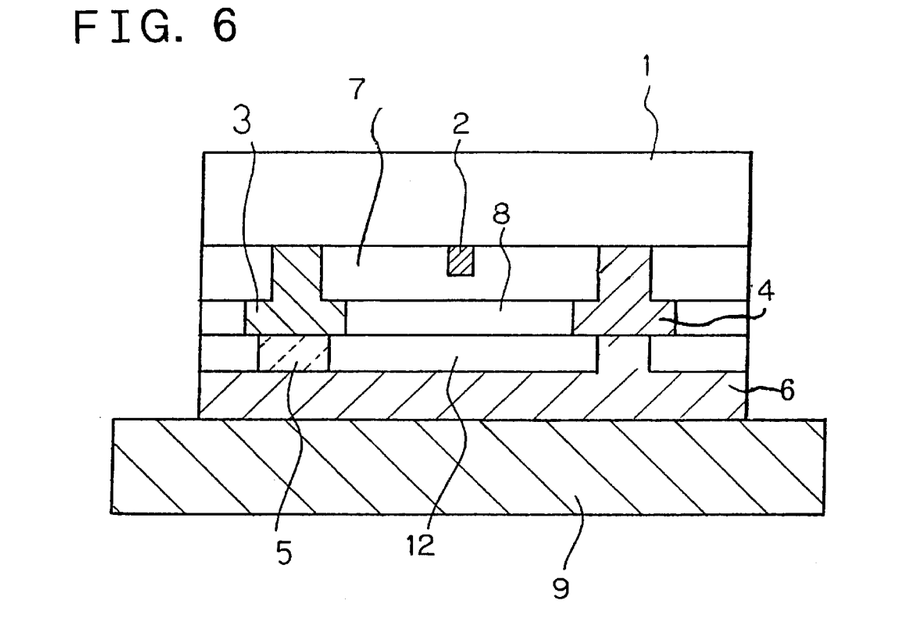
FIG. 6 is a cross-sectional view showing the mounted state of the semiconductor device according to the first embodiment of the present invention.

Alternatively, an insulator of high electrical insulating properties and good thermal conductivity (such as aluminum nitride (5 of FIG. 6)) is formed on a heat sink (9 of FIG. 9) and is contacted with an electrode of the active element, such as a drain electrode (3 of FIG. 6).

EXAMPLES

For illustrating the embodiments of the present invention in further detail, reference is had to the drawings by way of illustrating examples of the present invention.

Example 1

Figure 1:
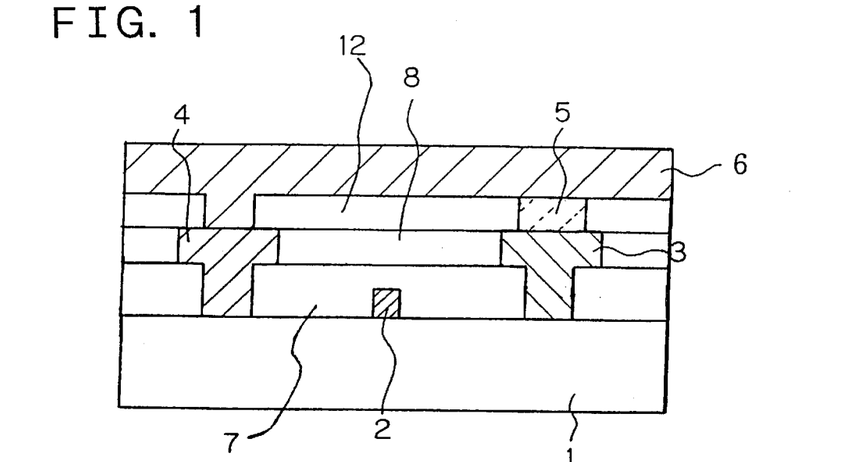
FIG. 1 is a cross-sectional view showing a semiconductor device according to a first embodiment of the present invention.
Figure 7:
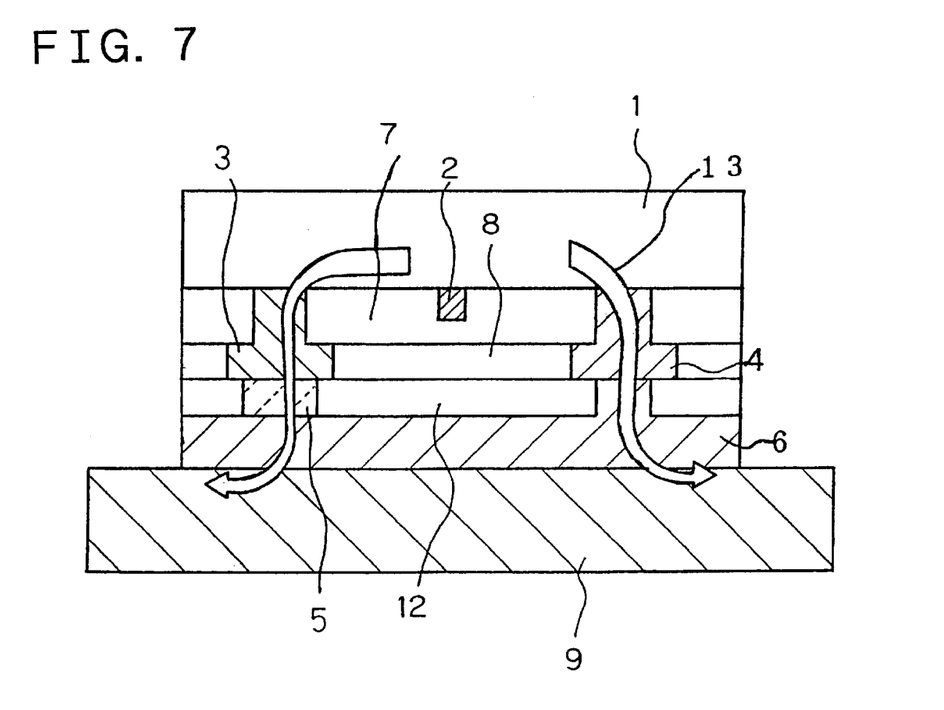
FIG. 7 is a schematic cross-sectional view showing the state of thermal diffusion (heat dissipation) of the semiconductor device according to the first embodiment of the present invention.

A first example of execution of the present invention is hereinafter explained. FIGS. 1 to 5 are cross-sectional views for illustrating the first example of the manufacturing method for the semiconductor device according to the present invention, wherein FIG. 1 shows the cross-section of the active element and FIGS. 2 to 5 are cross-sectional views showing the manufacturing method thereof step-by-step. FIG. 6 is a cross-sectional view schematically showing the state of mounting the active element on the package and FIG. 7 is a cross-sectional view schematically showing the state of thermal diffusion (heat dissipation) to the package.

First, a gate electrode 2 is formed on a substrate 1 of GaAs etc using a known technique and a first insulating film 7 is then deposited on the entire surface of the substrate 1.

In the portions of the first insulating film 7 where to form a source electrode 4 and a drain electrode 3 are formed openings and metal such as TiAu operating as a electrically conductive layer for plating is formed by sputtering to cause growth of metals such as Au to form the source electrode 4 and the drain electrode 3.

Then, a second insulating film 8 is deposited to overlie the first insulating film 7, source electrode 4 and the drain electrode 3. The resulting assembly is planarized using a known technique and etched back until the drain electrode 3 and the source electrode 4 are exposed to outside. (refer to FIG. 3)

An insulating member having high electrical insulating properties and thermal conductivity, such as aluminum nitride 5, is deposited on the entire surface of the substrate 1, using a chemical gas phase deposition (CVD). After coating a photoresist on the insulating member, the resist 10 is left only on the portion of the substrate surface in register with the drain electrode 3, by a known lithographic technique, and aluminum nitride on the exposed portion is etched off.

Figure 4:
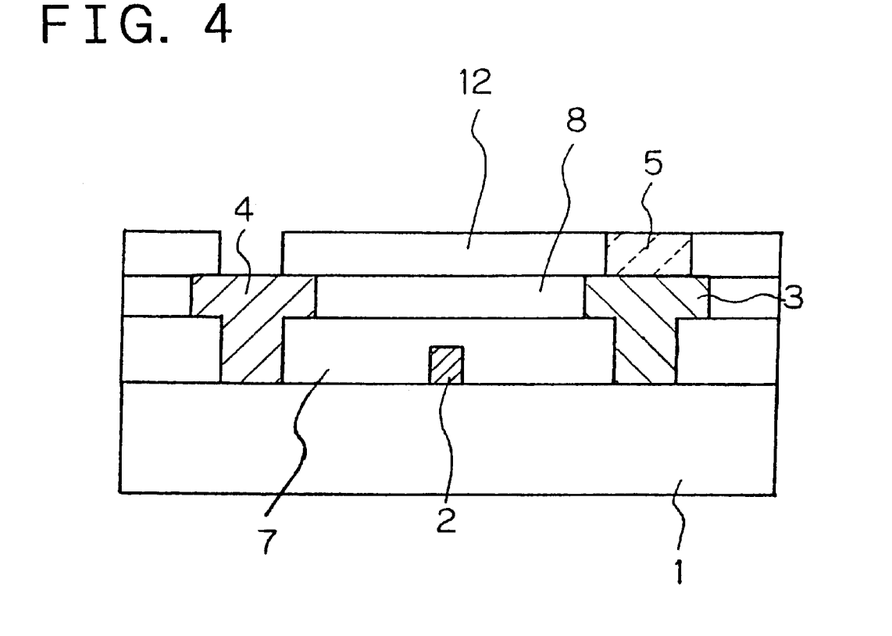
FIG. 4 is a cross-sectional view showing, step-by-step, the manufacturing method for the semiconductor device according to a first embodiment of the present invention.
Figure 5:
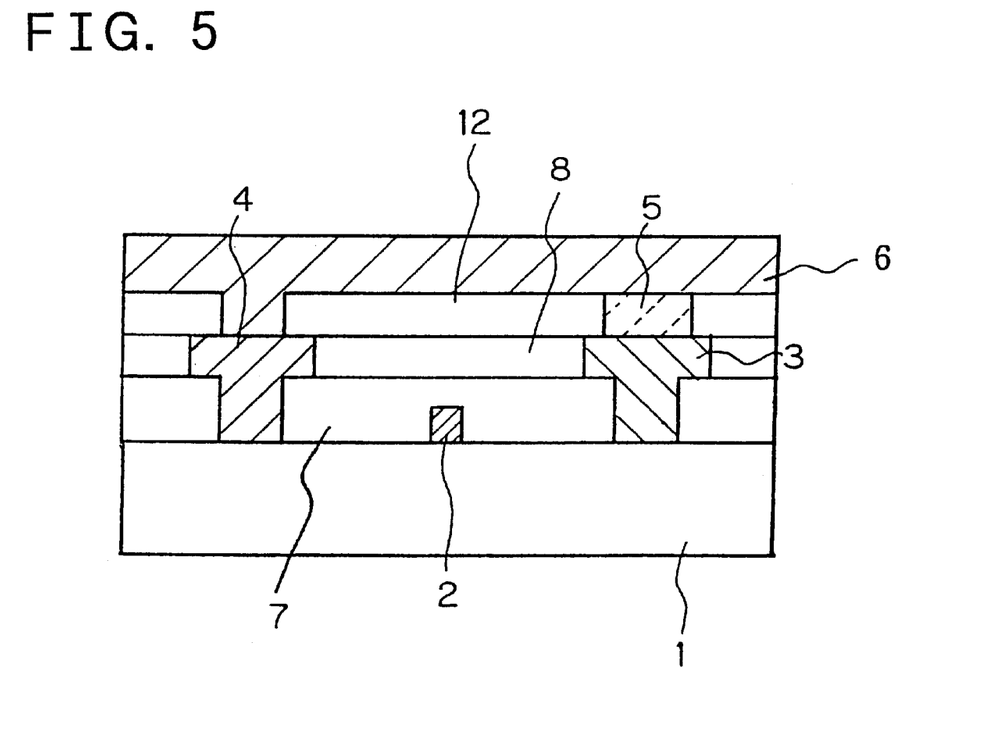
FIG. 5 is a cross-sectional view showing, step-by-step, the manufacturing method for the semiconductor device according to a first embodiment of the present invention.

Referring to FIG. 4, an insulating film 12 is deposited on the entire surface of the substrate 1, and subsequently the insulating film 12 is etched back for planarization, until aluminum nitride 5 is exposed. A portion of the insulating film 12 in register with the source electrode 4 is etched off to form an opening.

Then, a film of a metal, such as TiAu, operating as an electrically conductive layer for plating, is formed by a sputtering method etc. The metal such as Au is then grown by, for example, plating, to form an electrically conductive member (layer) 6. Since aluminum nitride 5 is exposed in this state in order to form the electrically conductive members 6 for plating TiAu and Au, the electrically conductive member 6 is also formed on the aluminum nitride 5 to assure sufficient thermal contact.

Finally, a heat sink of the active element and a package manufactured by the above process is mounted in accordance with the face-down system as shown in FIG. 6.

The above-described first embodiment of the present invention has the following meritorious effects. FIG. 7 schematically shows the effect of the first embodiment of the present invention. Referring to FIG. 7, heat evolved from an active element is radiated not only from the source electrode 4 but also from the drain electrode 3 via the electrically conductive member 6 and the aluminum nitride 5 exhibiting high thermal conductivity. Thus, the heat evolved from the active element is radiated via two channels to improve the thermal dissipation efficiency higher than that is possible with the conventional device.

Example 2

Figure 2:
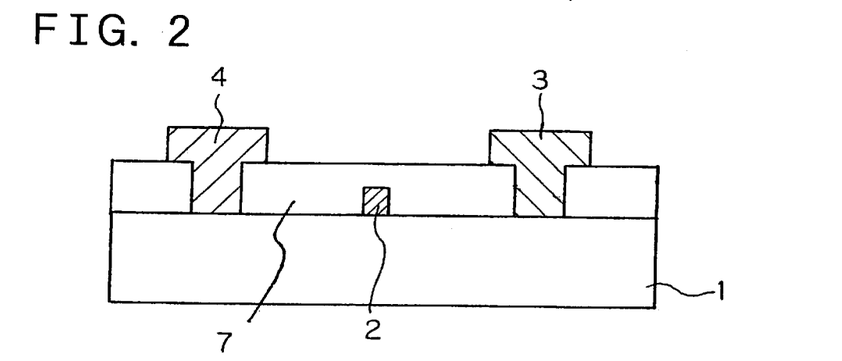
FIG. 2 is a cross-sectional view showing, step-by-step, the manufacturing method for the semiconductor device according to a first embodiment of the present invention.
Figure 3:
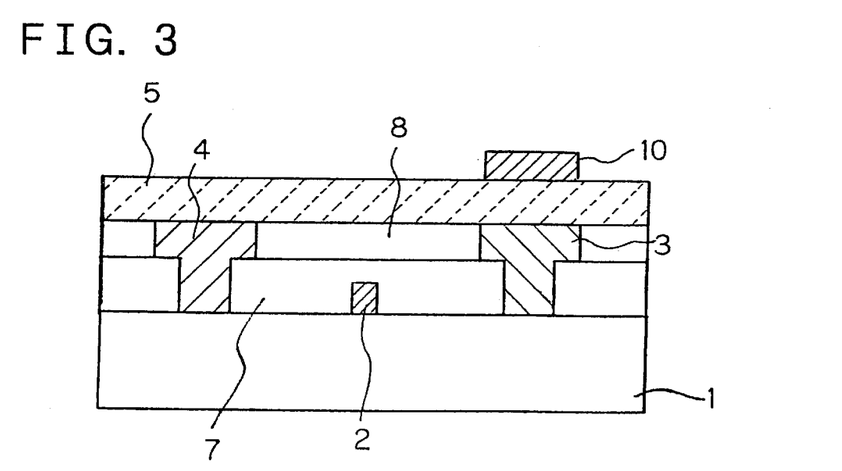
FIG. 3 is a cross-sectional view showing, step-by-step, the manufacturing method for the semiconductor device according to a first embodiment of the present invention.
Figure 8:
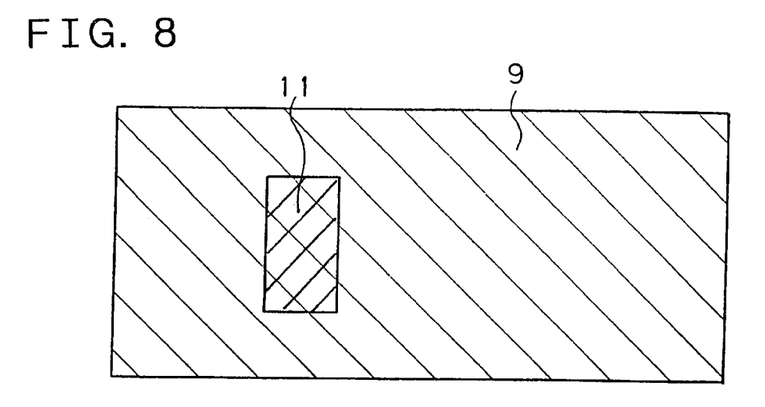
FIG. 8 is a cross-sectional view showing a semiconductor device according to a second embodiment of the present invention.
Figure 9:
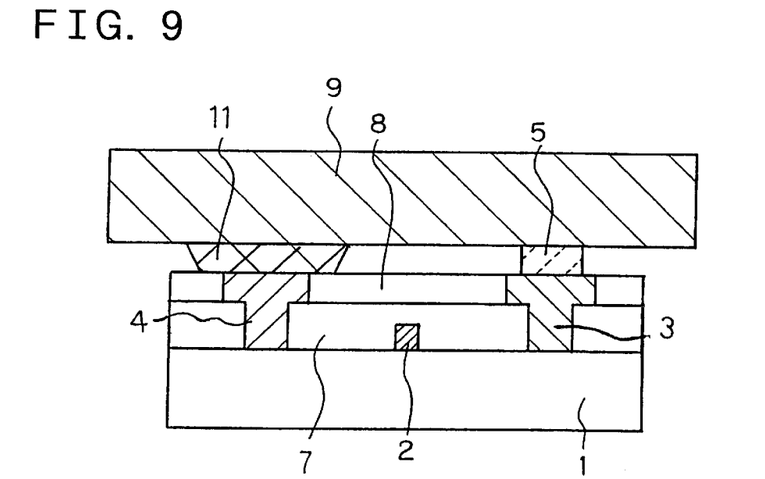
FIG. 9 is a cross-sectional view showing the mounted state of the semiconductor device according to the second embodiment of the present invention.

Next, a second example of the present invention is explained with reference to FIGS. 8 and 9 showing semiconductor device according to the present invention. Reference is had to FIGS. 2 and 3 explained with reference to the first Example as to the manufacturing method of the second Example of the present invention. The second Example, now explained, differs from the first Example mainly in that a protrusion of metal formed by Au plating is provided on a portion in register with the source electrode on the heat sink side of the package. First, the manufacturing method of the present example is explained.

On the substrate 1, a gate electrode 2, a first insulating film 7, a drain electrode 3 and a source electrode 4 are formed, using a conventional technique (see FIG. 2).

Then, a second insulating film 8 is deposited on the entire surface of the GaAs substrate 1, and the resulting assembly is etched back until the drain electrode 3 and the source electrode 4 are exposed.

Then, using the CVD method etc, aluminum nitride 5 is deposited on the entire surface of the substrate 1. After coating a photoresist on the insulator 5, the resist 10 is left only on a portion of the substrate 1 in register with the drain electrode 3, and aluminum nitride 5 of the exposed portion is etched off, with a use of a known photolithographic technique.

In the present Example, Au plating 11 is applied to a portion of the heat sink 9 of the flip-chip mounted package which faces the source electrode 4 of the active element bonded to the heat sink 9, as shown in FIG. 8.

The active element and the package, prepared as described above, are positioned so that the source electrode 4 of the active element faces/abuts to the Au plating 11 on the heat sink 9 of the package, and the active element and the package are bonded to each other by thermal pressure bonding for mounting, as shown in FIG. 9.

In the present Example, similarly to the first Example, heat generated by the active element is radiated to the heat sink 9 of the package not only from the source electrode 4 but also from the drain electrode 3 via the aluminum nitride 5 of high thermal conductivity. Moreover, since aluminum nitride 5 is directly contacted with the heat sink of the package, heat radiation efficiency is improved further.

Example 3

Figure 10:
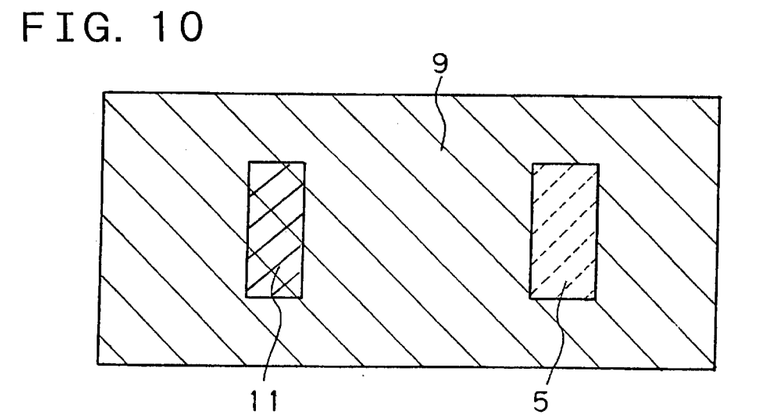
FIG. 10 is a cross-sectional view showing a semiconductor device according to a third embodiment of the present invention.
Figure 11:
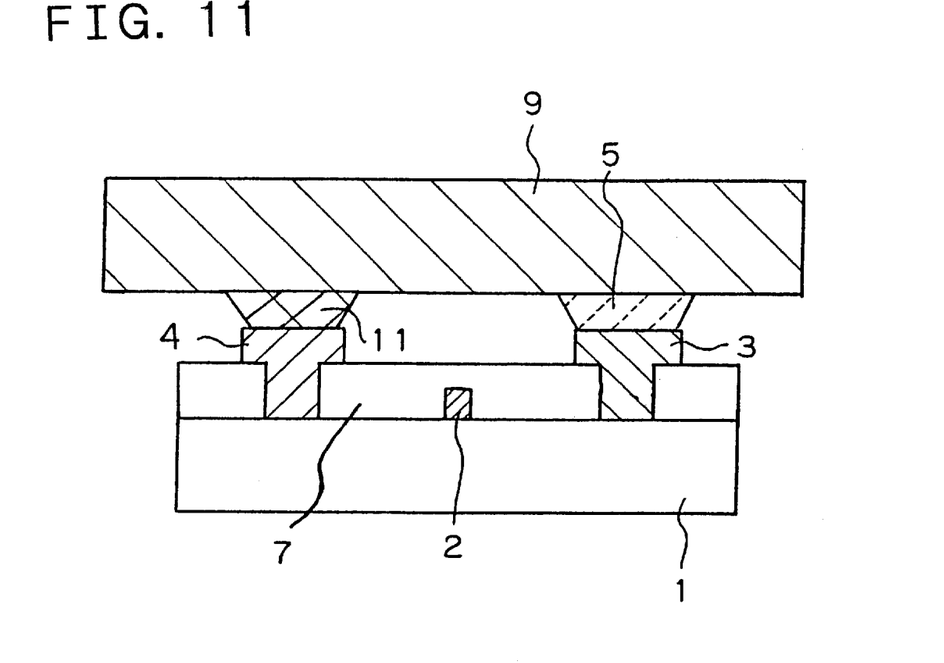
FIG. 11 is a cross-sectional view showing the mounted state of the semiconductor device according to the third embodiment of the present invention.

Next, a third example of the present invention is explained with reference to FIGS. 10 and 11 showing a semiconductor device and a manufacturing method thereof according to the third example of the present invention. Reference is had to FIG. 2 explained with reference to the first Example as to the manufacturing method of the third Example of the present invention. The second Example, now explained, differs from the first Example mainly in that a protrusion of metal formed by Au plating is provided on a portion in register with the source electrode on the heat sink side of the package and in that aluminum nitride is provided on a portion of the heat sink side in register with the drain electrode 3 First, the manufacturing method of the present invention is explained.

In the present Example, similarly to the first Example, described above, a gate electrode 2, a first insulating film 7, a drain electrode 3 and a source electrode 4 are formed by known techniques (FIG. 2).

In the present Example, Au plating 11 is applied to a portion of the heat sink 9 of the flip-chip mounted package which faces the source electrode 4 of the active element when the heat sink 9 is bonded to the source electrode 4, while aluminum nitride 5 is deposited on the portion of the heat sink 9 facing the drain electrode 3, as shown in FIG. 10.

The active element and the package, prepared as described above, are positioned so that the source electrode 4 of the active element faces the Au plating 11 on the heat sink 9 of the package, and so that the drain electrode 3 faces the aluminum nitride 5. In this state, the active element and the package are bonded to each other by thermal pressure bonding for mounting, as shown in FIG. 9.

In the present Example, similarly to the first Example, heat generated by the active element is radiated to the heat sink 9 of the package, via the aluminum nitride 5 of high thermal conductivity, not only from the source electrode 4 but also from the drain electrode 3. In the present Example, there is no necessity of forming the second insulating film, planarizing the insulating film or provision of hole on the side of the active element, thus significantly reducing the number of production steps.

Although aluminum nitride 5 is used in the above Example as an insulating member having superior thermal conductivity, it is sufficient if a material exhibits equivalent or superior properties, and for instance, alumina may be used.

It is unnecessary for the entire insulating member to exhibit insulating properties, it being only sufficient if an insulator is sufficient to assure electrical insulation of the heat sink member and a terminal of the active element connected to the insulating member is provided at a portion of a member designated herein as the insulating member.

The meritorious effect of the invention of the present invention are summarized as follows.

As explained in the foregoing, the present invention has the following meritorious effects.

The first meritorious effect of the present invention is that the heat evolved by the active element is radiated to the heat sink of the package via the electrically conductive member and a material (e.g. aluminum nitride) of high thermal conductivity not only from the source electrode but also from the drain electrode, so that the heat evolved by the active element is radiated via two or more paths, thus improving the heat diffusion/dissipation efficiency as compared to the conventional system.

The second meritorious effect of the present invention is that the number of the production steps for producing the semiconductor device can be reduced by providing the gold plating area or the area of insulating material (aluminum nitride) on the package side.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A method for producing a semiconductor device in which an active element formed on a substrate is connected to a heat sink member of a package accommodating said active element, comprising the steps of:
    (a) forming a gate electrode on said substrate;
    (b) forming a first insulating film having holes provided in the substrate at positions of a drain electrode and a source electrode respectively;
    (c) forming said drain electrode and said source electrode on said substrate;
    (d) providing on said package an insulating member at a position facing the drain electrode of said active element;
    (e) providing a metal protuberance on said package in register with the source electrode of said active element;
    (f) bonding said active element and the package so that said source electrode of said active element and the metal protuberance of said package contact each other and so that the drain electrode and the insulating member of said package contact each other.

2. The method for producing a semiconductor device as defined in claim 1 wherein said insulating member comprises aluminum nitride.

3. The method for producing a semiconductor device as defined in claim 1 wherein said active element is a FET formed on a GaAs substrate and wherein said insulating member comprises aluminum nitride.

* * * * *